(12) United States Patent
Son et al.

(10) Patent No.: US 6,841,428 B2
(45) Date of Patent: Jan. 11, 2005

(54) METHOD FOR FABRICATING THIN FILM TRANSISTOR LIQUID CRYSTAL DISPLAY

(75) Inventors: Kyoung Seok Son, Seoul (KR); Seung Moo Rim, Kyoungki-do (KR); Hyun Jin Kim, Kyoungki-do (KR); Jin Hui Cho, Kyoungki-do (KR)

(73) Assignee: Boe Hydis Technology Co., Ltd., Kyoungki-do (KR)

( * ) Notice: Subject to any disclaimer, the term of this patent is extended or adjusted under 35 U.S.C. 154(b) by 0 days.

(21) Appl. No.: 10/722,275

(22) Filed: Nov. 25, 2003

(65) Prior Publication Data

US 2004/0191969 A1 Sep. 30, 2004

(30) Foreign Application Priority Data

Mar. 31, 2003 (KR) .................................. 10-2003-0019956

(51) Int. Cl.⁷ ................................................ H01L 21/84
(52) U.S. Cl. ........................................ 438/149; 438/151
(58) Field of Search ................................. 438/149–166

(56) References Cited

U.S. PATENT DOCUMENTS 6,399,428 B2 * 6/2002 Nakahori et al. ........... 438/161
6,589,825 B2 * 7/2003 Kim .......................... 438/151

* cited by examiner

*Primary Examiner*—Jack Chen
(74) *Attorney, Agent, or Firm*—Ladas & Parry LLP

(57) ABSTRACT

The present invention relates to a method for fabricating a thin film transistor liquid crystal display, which comprises the steps of: forming a gate electrode on an insulating substrate; successively forming first and second insulating films on the insulating substrate including the gate electrode, the first insulating film being formed under first deposition conditions including power, pressure and electrode interval, the second insulating film being formed under second deposition conditions where at least one of the first deposition conditions is changed continuously over time; successively forming first and second amorphous silicon layers on the second insulating film to form an active layer; successively forming an ohmic contact layer and a source/drain electrode on the active layer; and forming a protective film on the resulting structure including the source/drain electrode.

10 Claims, 2 Drawing Sheets

METHOD FOR FABRICATING THIN FILM TRANSISTOR LIQUID CRYSTAL DISPLAY

BACKGROUND OF THE INVENTION

1. Field of the Invention

The present invention relates to a method for fabricating a thin film transistor liquid crystal display, and more particularly, to a method for fabricating a thin film transistor liquid crystal display, in which the conditions of plasma enhanced chemical vapor deposition are changed continuously so as to relieve stress in an insulating substrate and prevent the bending of the substrate.

2. Description of the Prior Art

Generally, the weight and thickness of a thin film transistor liquid crystal display, which is used in mobile communication devices such as notebooks, mobile phones and PDA, are being gradually reduced. For this purpose, the thickness and density of a glass substrate are being gradually reduced.

Thus, with a reduction in the substrate thickness, when multilayers (namely, an insulating layer of SiN, an active layer of amorphous silicon and an ohmic contact layer of impure amorphous silicon) which are formed to a large thickness at the highest temperature in a fabricating process of a thin film transistor are deposited by plasma enhanced chemical vapor deposition (PECVD), the phenomenon of bending of the glass substrate caused by stress remarkably appears.

In forming these prior multilayers, a SiN layer, an amorphous silicon layer and an impure ohmic contact layer are successively deposited to form an insulating layer, an active layer and an ohmic contact layer in a liquid crystal display device. Such multilayers are deposited under different deposition conditions (the kind of gas used, the flow rate of gas, the interval between electrodes, power and pressure).

Moreover, in the plasma enhanced chemical vapor deposition, since the transfer of energy by chemical reaction and plasma is achieved after the activation of reaction gas with plasma, most of compressive stress occurs in the insulating layer and the active layer.

In other words, the insulating layer is mainly made of SiN or SiON. A first insulating film of this insulting layer is deposited under conditions having little or no stress since it must have a thickness sufficient to provide the insulation between a gate electrode and a data electrode. On the other hand, a second insulating film forming an interface with the active layer is deposited under conditions having no roughness and excellent interface properties in view of the characteristics of a thin film transistor. Therefore such deposition conditions for the second insulating film are abruptly changed from those for the first insulating film.

Furthermore, even in the case of first and second amorphous silicon layers forming the active layer, the first amorphous silicon layer forming a channel layer at several hundreds or more of angstroms is deposited under a condition with less defect density and low deposition rate, but the second amorphous silicon layer is deposited under a condition of high deposition rate for the purpose of increasing productivity. This deposition condition for the second amorphous silicon layer is abruptly changed from one for the first amorphous silicon layer.

However, this abrupt change in deposition condition disadvantageously makes it difficult to match the insulating and active layers with the lower layer, so that stress in both the insulating substrate and thin film transistor is caused and as a result of this stress the TFT substrate undergoes bending. Thus, the characteristics of the thin film transistor deteriorate and the bending of the insulating substrate is increased so as to increase the possibility of the substrate breakdown in subsequent processes, thereby reducing yield.

SUMMARY OF THE INVENTION

Accordingly, the present invention has been made to solve the above-mentioned problems occurring in the prior art, and an object of the present invention is to provide a method for fabricating a thin film transistor liquid crystal display, in which deposition conditions for the insulating and active layers are changed continuously over time so as to relieve stress in a substrate, so that the bending and thus breakdown of the insulating substrate can be prevented so as to increase yield, and the characteristics of the thin film transistor are prevented from deteriorating due to stress.

To achieve the above-mentioned object, in one embodiment, the present invention provides a method for fabricating a thin film transistor liquid crystal display, which comprises the steps of: forming a gate electrode on an insulating substrate; successively forming first and second insulating films on the insulating substrate including the gate electrode, the first insulating film being formed under first deposition conditions including power, pressure and electrode interval, the second insulating film being formed under second deposition conditions where at least one of the first deposition conditions is changed continuously over time; successively forming first and second amorphous silicon layers on the second insulating film to form an active layer; successively forming an ohmic contact layer and a source/drain electrode on the active layer; and forming a protective film on the resulting structure including the source/drain electrode.

In another embodiment, the present invention provides a method for fabricating a thin film transistor liquid crystal display, which comprises the steps of: forming a gate electrode on an insulating substrate; successively forming first and second insulating films on the insulating substrate including the gate electrode, the first insulating film being formed under first deposition conditions including power, pressure and electrode interval, the second insulating film being formed under second deposition conditions where at least one of the first deposition conditions is changed continuously over time; successively forming first and second amorphous silicon layers on the second insulating film, the first amorphous silicon layer being formed under third deposition conditions including power, pressure and electrode interval, the second amorphous silicon layer being formed under fourth deposition conditions where at least one of the third deposition conditions is changed continuously over time; successively forming an ohmic contact layer and a source/drain electrode on the active layer; and forming a protective film on the resulting structure including the source/drain electrode.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Hereinafter, a preferred embodiment of the present invention will be described in detail with reference to the accompanying drawings.

Figure 1:
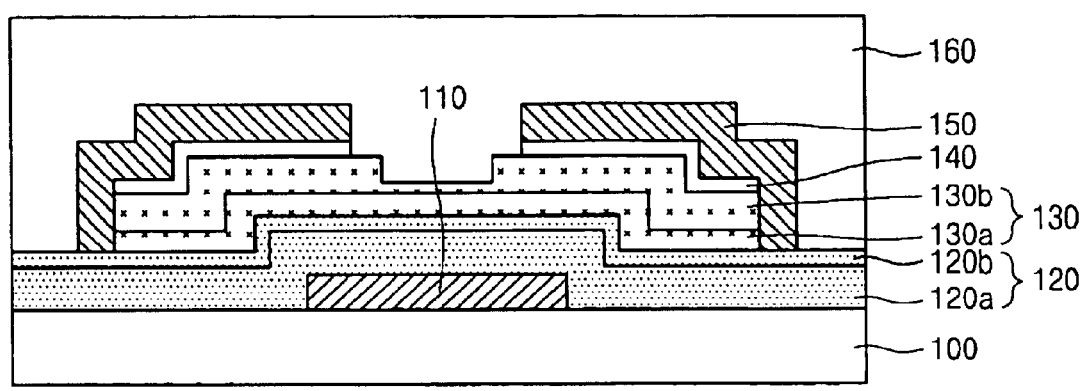
FIG. 1 is a cross-sectional view illustrating a method for fabricating a thin film transistor liquid crystal display according to a preferred embodiment of the present invention.
Figure 2A:
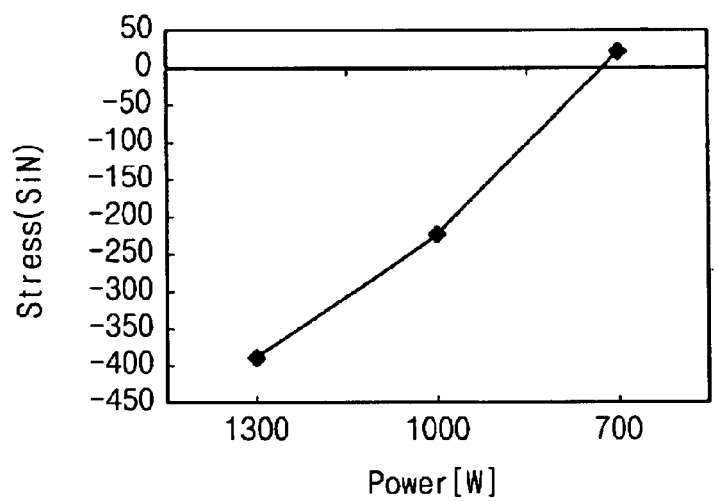
FIGS. 2a and 2b are graphs showing a change in stress according to power and pressure in a fabricating method of the present invention.
Figure 2B:
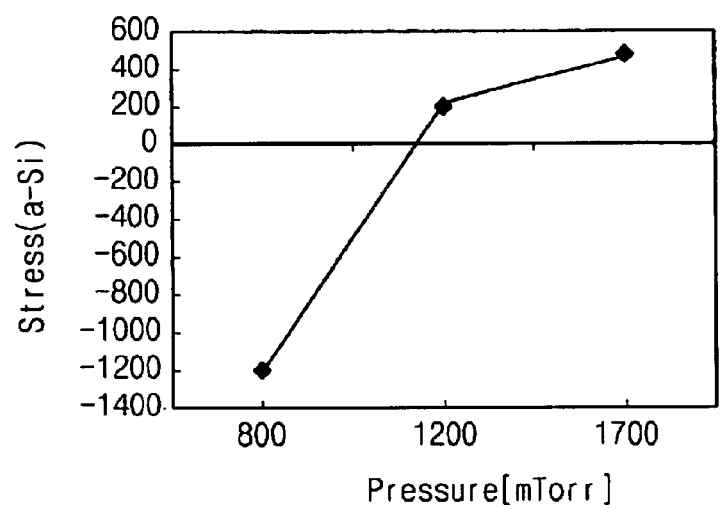

As shown in FIG. 1, a gate electrode 110 is first formed on a transparent insulating substrate 100.

Then, a first insulating film 120a and a second insulating film 120b are successively deposited on the insulating substrate 100 including the gate electrode 110 by PECVD, thereby forming an insulating layer 120. At this time, the first insulating film 120a is deposited under first deposition conditions including power, the interval between electrodes, and pressure, and the second insulating film 120b is deposited under second deposition conditions where at least one of the first deposition conditions is changed continuously over time. Since such changes in deposition conditions for the second insulating film are not abrupt, stress in the insulating substrate 100 is relieved to prevent the bending of the insulating substrate 100.

For example, when the first insulating film 120a is formed under the first deposition conditions, such as a power of 1,300 W, an electrode interval of 1,000 mils and a pressure of 1,700 mTorr, and the second insulating film 120b is formed under the second deposition conditions, such as a power of 1,300 W, an electrode interval of 600 mils and a pressure of 1,200 mTorr, the deposition process of the second insulating film 120b is carried out while the electrode interval is changed continuously from 1,000 mils to 600 mils over time and the pressure is changed continuously from 1,700 mTorr to 1,200 mTorr over time. In other words, since the interval between electrodes in a general PECVD system is regulated by the rotation of a motor, a continuous increase or reduction in the rotation speed of the motor allows the electrode interval to be changed continuously over time. Furthermore, since pressure is regulated by the pumping speed of a pump, the continuous regulation of the pumping speed allows pressure to be changed continuously over time.

For example, if the first insulating film is deposited to a thickness of about 2,000–5,000 Å, and preferably about 3,000–4,000 Å, the second insulating film will be deposited to a thickness of about 350–650 Å, and preferably 450–550 Å.

Thereafter, a first amorphous silicon layer 130a and a second amorphous silicon layer 130b are successively deposited on the second insulating film 120b to form an active layer 130. At this time, the first amorphous silicon layer 130a is deposited under third deposition conditions including power, the interval between electrodes, and pressure, and the second amorphous silicon layer 130b is deposited under fourth deposition conditions where at least one of the third deposition conditions is changed continuously over time. Since such changes in deposition conditions for the second amorphous silicon layer are not abrupt, stress in the insulating substrate 100 is relieved to prevent the bending of the insulating substrate 100. For example, the first amorphous silicon layer is deposited under the third deposition conditions, such as an electrode interval of about 500–550 mils, a pressure of about 2,500–3,500 mTorr and a power of about 100–200 W, and the second amorphous silicon layer is deposited under the fourth conditions where electrode interval and pressure are maintained at the same level as those for the deposition of the first amorphous silicon layer but power is changed continuously from one for the first amorphous silicon layer (i.e., 100–200 W) to about 300–600 W over time. At this time, the thickness of the first amorphous silicon film can be about 200–500 Å, and the thickness of the second amorphous silicon layer can be about 1,300 . 1,600 Å. However, it is to be noted that the second amorphous silicon layer can be deposited under conditions electrode interval and/or pressure in addition to power is changed continuously over time. It will be understood that various modifications to the above embodiment are possible.

Next, an ohmic contact layer 140 and a source/drain electrode 150 are successively formed on the second amorphous silicon layer 130b.

Following this, a protective film 160 is formed on the resulting structure including the source/drain electrode 150. At this time, the deposition of the protective film 160 is carried out in the same manner as the deposition of the insulating layer as described above. In other words, power, the interval between electrodes and pressure are continuously changed over time, so that stress is relieved to prevent the bending of the insulating substrate 100.

Subsequent processes are the same as in the prior art, and thus, a description thereof will be avoided.

As described above, according to the present invention, deposition conditions for the insulating and active layers are continuously changed so as to relieve stress in the insulating substrate, so that the bending of the insulating substrate can be reduced, thereby preventing the breakdown of the substrate and increasing yield.

Furthermore, the deterioration in characteristics of the thin film transistor caused by stress is prevented so that a flat liquid crystal display can be produced.

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. A method for fabricating a thin film transistor liquid crystal display, which comprises the steps of:

forming a gate electrode on an insulating substrate;

successively forming first and second insulating films on the insulating substrate including the gate electrode, the first insulating film being formed under first deposition conditions including power, pressure and electrode interval, the second insulating film being formed under second deposition conditions where at least one of the first deposition conditions is changed continuously over time;

successively forming first and second amorphous silicon layers on the second insulating film to form an active layer;

successively forming an ohmic contact layer and a source/drain electrode on the active layer; and forming a protective film on the resulting structure including the source/drain electrode.

2. The method of claim 1, wherein at least one of the first deposition conditions for the first insulating film is changed continuously over time until the second deposition conditions of the second insulating film.

3. The method of claim 2, wherein the electrode interval is changed continuously by regulation of the rotation speed of a motor, and the pressure is changed continuously by regulation of the pumping speed of a pump.

4. The method of claim 2, wherein the electrode interval is changed continuously from 1,000 mils to 600 mils, and the pressure is changed continuously from 1,700 mTorr to 1,200 mTorr.

5. The method of claim 1, wherein the first amorphous silicon layer is deposited under third deposition conditions including power, pressure and the interval between electrodes, and the second amorphous silicon layer is deposited under fourth deposition conditions where at least one of the third deposition conditions is changed continuously over time.

6. The method of claim 5, wherein the power of the third deposition conditions is changed continuously from 100 W to 600 W.

7. A method for fabricating a thin film transistor liquid crystal display, which comprises the steps of:

forming a gate electrode on an insulating substrate;

successively forming first and second insulating films on the insulating substrate including the gate electrode, the first insulating film being formed under first deposition conditions including power, pressure and electrode interval, the second insulating film being formed under second deposition conditions where at least one of the first deposition conditions is changed continuously over time;

successively forming first and second amorphous silicon layers on the second insulating film, the first amorphous silicon layer being formed under third deposition conditions including power, pressure and electrode interval, the second amorphous silicon layer being formed under fourth deposition conditions where at least one of the third deposition conditions is changed continuously over time;

successively forming an ohmic contact layer and a source/drain electrode on the active layer; and forming a protective film on the resulting structure including the source/drain electrode.

8. The method of claim 7, wherein the electrode interval of the first deposition conditions is changed continuously by regulation of the rotation speed of a motor, and the pressure of the first deposition conditions is changed continuously by regulation of the pumping speed of a pump.

9. The method of claim 7, wherein the electrode interval of the first deposition conditions is continuously changed from 1,000 mils to 600 mils, and the pressure of the first deposition conditions is continuously changed from 1,700 mTorr to 1,200 mTorr.

10. The method of claim 7, wherein the power of the third deposition conditions is changed continuously from 100W to 600 W.

* * * * *